US012567838B2

(12) United States Patent
Saito

(10) Patent No.: US 12,567,838 B2
(45) Date of Patent: Mar. 3, 2026

(54) SPEAKER DISTORTION CORRECTION DEVICE

(71) Applicant: ALPS ALPINE CO., LTD., Tokyo (JP)

(72) Inventor: Yuji Saito, Fukushima (JP)

(73) Assignee: ALPS ALPINE CO., LTD., Tokyo (JP)

( * ) Notice: Subject to any disclaimer, the term of this patent is extended or adjusted under 35 U.S.C. 154(b) by 154 days.

(21) Appl. No.: 18/606,415

(22) Filed: Mar. 15, 2024

(65) Prior Publication Data

US 2024/0333232 A1 Oct. 3, 2024

(30) Foreign Application Priority Data

Apr. 3, 2023 (JP) ................................ 2023-060188

(51) Int. Cl.
*H03F 1/32* (2006.01)
*H04R 3/00* (2006.01)

(52) U.S. Cl.
CPC ........... *H03F 1/3264* (2013.01); *H04R 3/007* (2013.01); *H03F 2201/3236* (2013.01)

(58) Field of Classification Search
CPC ........... H03F 1/3264; H03F 2201/3236; H03F 2200/03; H03F 3/183; H03F 3/21;
(Continued)

(56) References Cited

U.S. PATENT DOCUMENTS

| | | | | |
|---|---|---|---|---|
| 12,035,115 B2 * | 7/2024 | Saito | ...................... | H04R 3/007 |
| 2010/0271124 A1 * | 10/2010 | Lozhkin | ................ | H03F 1/3247 330/149 |

(Continued)

FOREIGN PATENT DOCUMENTS

| | | |
|---|---|---|
| JP | 2022-143855 | 10/2022 |
| WO | 2014/045123 | 3/2014 |
| WO | 2016/124896 | 8/2016 |

OTHER PUBLICATIONS

Extended European Search Report for EP24166215.4 mailed on Dec. 4, 2024.

(Continued)

*Primary Examiner* — Xu Mei
(74) *Attorney, Agent, or Firm* — IPUSA, PLLC

(57) ABSTRACT

A speaker distortion correction device includes an amplifier configured to drive a speaker; and a distortion corrector. An input signal is input to the distortion corrector, and an output of the distortion corrector is input to the amplifier. The distortion corrector includes a nonlinear distortion controller configured to generate a corrected signal obtained by performing a nonlinear distortion correction process on the input signal so that nonlinear distortion of the speaker is suppressed when the corrected signal is input to the amplifier; a maximum value calculating section configured to calculate a maximum output value of the amplifier to be obtained when the corrected signal is input to the amplifier, based on at least the input signal; and a selector configured to select the corrected signal when the maximum output value does not exceed a predetermined threshold and select the input signal when the maximum output value exceeds the predetermined threshold.

11 Claims, 13 Drawing Sheets

(58) Field of Classification Search
CPC ...... H04R 3/007; H04R 3/002; H04R 31/003; H04R 2231/001
USPC ............................................... 381/59, 96, 55
See application file for complete search history.

(56) References Cited

U.S. PATENT DOCUMENTS

| | | | | |
|---|---|---|---|---|
| 2013/0230191 | A1* | 9/2013 | Hoang Co Thuy ...... | H04R 3/08 381/104 |
| 2014/0341394 | A1* | 11/2014 | Croft, III ................. | H04R 3/04 381/102 |
| 2016/0241960 | A1* | 8/2016 | Cheng .................. | H03G 3/3005 |
| 2021/0204043 | A1* | 7/2021 | Christoph .............. | H04R 3/007 |
| 2023/0012785 | A1 | 1/2023 | Saito et al. | |

OTHER PUBLICATIONS

Kajikawa Yoshinobu, "Nonlinear distortion correction of speaker system by signal processing technique", Journal of the Acoustical Society of Japan, vol. 67, No. 10, pp. 470-475, 2011.

* cited by examiner

FIG.6B

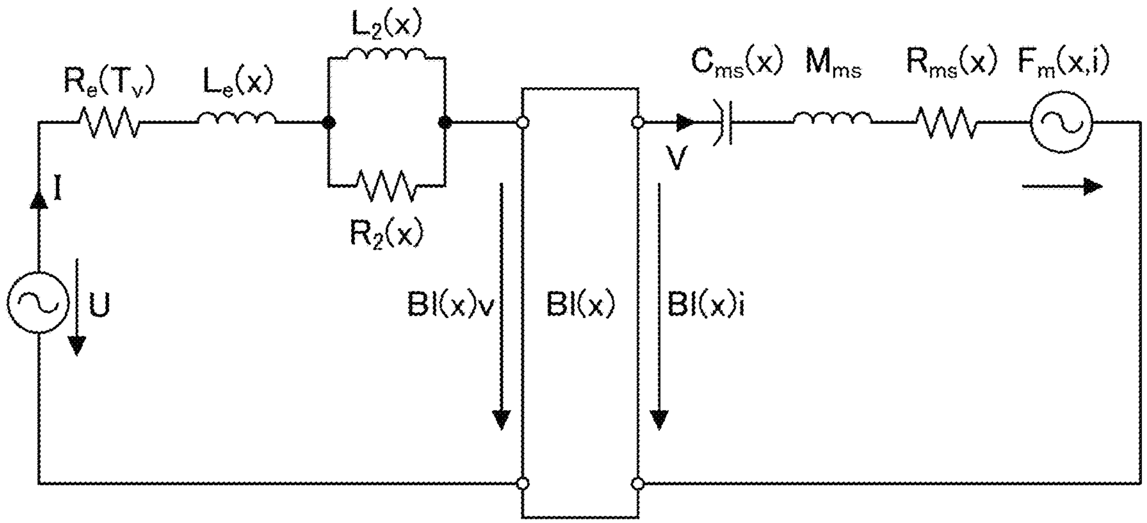

$R_e(T_v)$: PURE RESISTANCE COMPONENT OF VOICE COIL
$L_e(x)$: INDUCTANCE OF VOICE COIL
$L_2(x)$: PURE RESISTANCE COMPONENT OF LOAD LOSS GENERATED BY EDDY CURRENT
$R_2(x)$: INDUCTANCE COMPONENT GENERATED BY EDDY CURRENT
Bl(x)v: ELECTROMOTIVE FORCE GENERATED BY MOVEMENT OF CONDUCTOR IN MAGNETIC FIELD
Bl(x)i: LORENTZ FORCE
$C_{ms}(x)$: INVERSE OF SPRING CONSTANT $K_{ms}(x)$
$M_{ms}$: MASS IN VIBRATION SYSTEM
$R_{ms}(x)$: MECHANICAL RESISTANCE
$F_m(x,i)$: MAGNETIC RESISTANCE FORCE (= 1/2 $dL_e(x)dx\ i^2$)

SPEAKER DISTORTION CORRECTION DEVICE

CROSS-REFERENCE TO RELATED APPLICATIONS

This patent application is based on and claims priority to Japanese Patent Application No. 2023-060188 filed on Apr. 3, 2023, the entire contents of which are incorporated herein by reference.

TECHNICAL FIELD

The present disclosure relates to a technique of correcting distortion of an output of a speaker with respect to an input.

BACKGROUND

As a technique of correcting distortion of an output of a speaker with respect to an input, in a configuration in which an output of a sound source device is output to a speaker through a nonlinear part correction filter, an adaptive filter, and an amplifier, a technique of setting a transfer characteristic for canceling nonlinear distortion due to a nonlinear characteristic of the speaker in the nonlinear part correction filter, and adapting a transfer characteristic of the adaptive filter by using a difference between target vibration of the speaker and actual vibration of the speaker detected by a sensor as an error is known (for example, Patent Document 1).

Additionally, as a technique of correcting distortion of an output of a speaker with respect to an input, a technique of correcting nonlinear distortion of a speaker by using a mirror filter is also known (for example, Non-Patent Document 1).

RELATED ART DOCUMENT

Patent Document

[Patent Document 1] Japanese Laid-open Patent Application Publication No. 2022-143855

Non-Patent Document

[Non-Patent Document 1] KAJIKAWA Yoshinobu (Faculty of Engineering Science, Kansai University), "Nonlinear distortion correction of speaker system by signal processing technique", Journal of The Acoustical Society of Japan, Vol. 67, No. 10 (2011), pp. 470-475

SUMMARY

According to one embodiment of the present disclosure, a speaker distortion correction device includes an amplifier configured to drive a speaker; and a distortion corrector. An input signal is input to the distortion corrector, and an output of the distortion corrector is input to the amplifier. The distortion corrector includes a nonlinear distortion controller configured to generate a corrected signal obtained by performing a nonlinear distortion correction process on the input signal to correct the input signal so that nonlinear distortion of the speaker is suppressed when the corrected signal is input to the amplifier; a maximum value calculating section configured to calculate a maximum output value of the amplifier to be obtained when the corrected signal generated by the nonlinear distortion controller is input to the amplifier, based on at least the input signal; and a selector configured to select, as the output of the distortion corrector, the corrected signal generated by the nonlinear distortion controller when the maximum output value calculated by the maximum value calculating section does not exceed a predetermined threshold and select, as the output of the distortion corrector, the input signal on which the nonlinear distortion correction process is not performed by the nonlinear distortion controller when the maximum output value calculated by the maximum value calculating section exceeds the predetermined threshold.

BRIEF DESCRIPTION OF THE DRAWINGS

FIG. 6B is a diagram illustrating an equivalent circuit of the speaker;

DETAILED DESCRIPTION OF EMBODIMENTS

Figure 1:
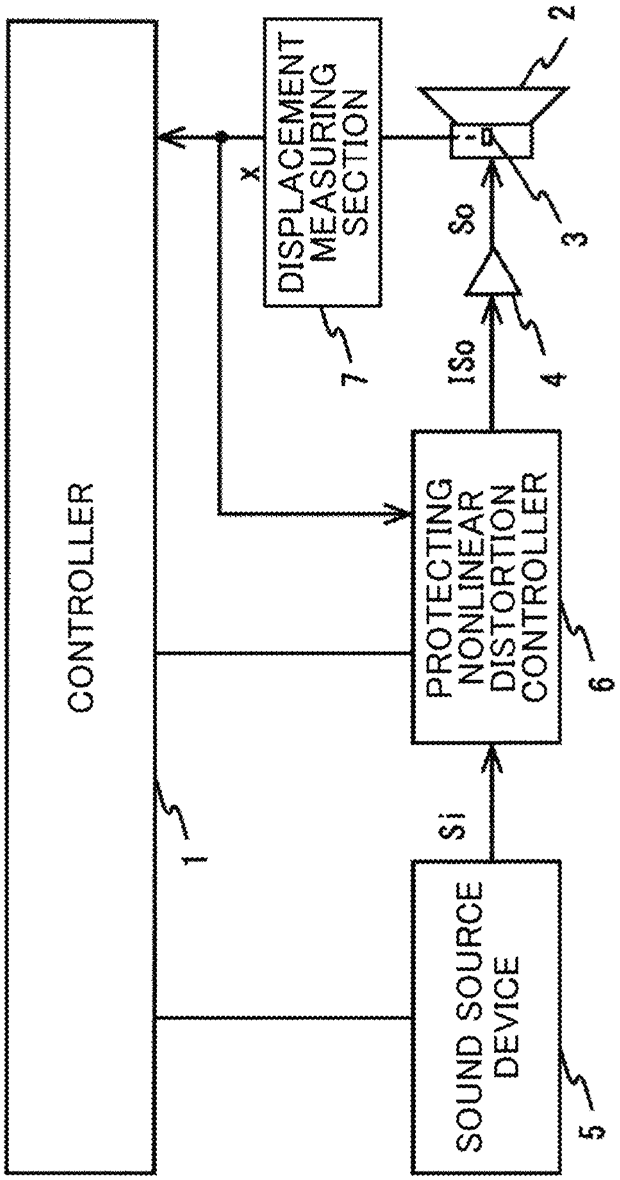
FIG. 1 is a diagram illustrating a configuration of a sound system according to an embodiment of the present disclosure.

Distortion of a speaker is dominated by nonlinear distortion, and in a region where an output level of an amplifier for driving a speaker is high, that is, in a region where a displacement of a vibration system of a speaker is great, the influence of the nonlinearity of the driving force or stiffness applied to the speaker is particularly great. Therefore, in such a region, when the above-described technique of correcting the nonlinear distortion is applied to cancel the great influence of the nonlinearity, the output of the amplifier significantly increases.

When the output of the amplifier excessively increases, an abnormality of the speaker may occur, such as generation of abnormal noise due to clipping of the output of the speaker caused by the voice coil bobbin contacting the bottom of the speaker or saturation of the amplifier, occurrence of a failure in which a vibration system member is damaged due to excessive amplitude in which the displacement of an elastic body reaches a fracture region, and the like. Therefore, it is desirable to correct nonlinear distortion of a speaker as much as possible while suppressing the occurrence of the abnormality of the speaker.

According to the present disclosure, a speaker distortion correction device for correcting distortion of an output of a speaker with respect to an input signal, includes an amplifier configured to drive the speaker, and a distortion corrector. The input signal is input to the distortion corrector and an output of the distortion corrector is input to the amplifier. Here, the distortion corrector includes a nonlinear distortion controller configured to generate a corrected signal obtained by performing, on the input signal, a nonlinear distortion correction process of correcting a signal so that nonlinear distortion of the speaker is suppressed when the corrected signal is input to the amplifier, a maximum value calculating section configured to calculate a maximum output value of the amplifier to be obtained when the corrected signal generated by the nonlinear distortion controller is input to the amplifier, based on at least the input signal, and a selector configured to select, as the output of the distortion corrector, the corrected signal generated by the nonlinear distortion controller when the maximum output value calculated by the maximum value calculating section does not exceed a predetermined threshold, and select, as the output of the distortion corrector, the input signal on which the nonlinear distortion correction process is not performed by the nonlinear distortion controller when the maximum output value calculated by the maximum value calculating section exceeds the predetermined threshold.

According to the present disclosure, a speaker distortion correction device for correcting distortion of an output of a speaker with respect to an input signal, includes an amplifier configured to drive the speaker, and a distortion corrector. The input signal is input to the distortion corrector and an output of the distortion corrector is input to the amplifier. Here, the distortion corrector includes a nonlinear distortion controller configured to generate, as an output of the distortion corrector, a signal obtained by performing, on a signal, a nonlinear distortion correction process of correcting the signal so that nonlinear distortion of the speaker is suppressed when the corrected signal is input to the amplifier, an attenuator configured to attenuate the input signal with a variable attenuation amount and output the attenuated input signal, a maximum value calculating section configured to calculate a maximum output value of the amplifier to be obtained when the signal obtained by performing the nonlinear distortion correction process on the input signal is input to the amplifier, based on at least the input signal, and a selector configured to select, as the output of the distortion corrector, the signal obtained by performing the nonlinear distortion correction process on the input signal when the maximum output value calculated by the maximum value calculating section does not exceed a predetermined threshold, and select, as the output of the distortion corrector, the signal obtained by performing the nonlinear distortion correction process on the attenuated input signal generated by an attenuation amount being set in the attenuator so that a level of the attenuated input signal is less than or equal to a predetermined level when the maximum output value calculated by the maximum value calculating section exceeds the predetermined threshold.

Additionally, according to the present disclosure, a speaker distortion correction device for correcting distortion of an output of a speaker with respect to an input signal, includes an amplifier configured to drive the speaker, and a distortion corrector. The input signal is input to the distortion corrector and an output of the distortion corrector is input to the amplifier. Here, the distortion corrector includes a band divider configured to divide the input signal into a plurality of band input signals for a plurality of bands, a plurality of band distortion correctors provided respectively corresponding to the plurality of bands, the plurality of band input signals being respectively input to the plurality of band distortion correctors, and a mixer configured to synthesize outputs of the band distortion correctors as an output of the distortion corrector.

Additionally, each of plurality of band distortion correctors includes a nonlinear distortion controller configured to generate a corrected signal obtained by performing, on the band input signal, a nonlinear distortion correction process of correcting a signal so that nonlinear distortion of the speaker is suppressed when the corrected signal is input to the amplifier, a maximum value calculating section configured to calculate a maximum output value of the amplifier to be obtained when the corrected signal generated by the nonlinear distortion controller is input to the amplifier, based on at least the band input signal, and a selector configured to select, as the output of the band distortion corrector, the corrected signal generated by the nonlinear distortion controller when the maximum output value calculated by the maximum value calculating section does not exceed a predetermined threshold, and select, as the output of the band distortion corrector, the band input signal on which the nonlinear distortion correction process is not performed by the nonlinear distortion controller when the maximum output value calculated by the maximum value calculating section exceeds the predetermined threshold.

Additionally, according to the present disclosure, a speaker distortion correction device for correcting distortion of an output of a speaker with respect to an input signal, includes an amplifier configured to drive the speaker, and a distortion corrector. The input signal is input to the distortion corrector and an output of the distortion corrector is input to the amplifier. Here, the distortion corrector includes a band divider configured to divide the input signal into a plurality of band input signals for a plurality of bands, a plurality of band distortion correctors provided respectively corresponding to the plurality of bands, the plurality of band input signals being respectively input to the plurality of band distortion correctors, and a mixer configured to synthesize outputs of the plurality of band distortion correctors as an output of the distortion corrector.

Additionally, each of the band distortion correctors includes a nonlinear distortion controller configured to generate a signal obtained by performing, on a signal, a nonlinear distortion correction process of correcting the signal so that nonlinear distortion of the speaker is suppressed when the corrected signal is input to the amplifier, as an output of the band distortion corrector, an attenuator configured to attenuate the band input signal with a variable attenuation amount and output the attenuated input signal, a maximum value calculating section configured to calculate a maximum output value of the amplifier to be obtained when the signal obtained by performing the nonlinear distortion correction process on the band input signal is input to the amplifier by the nonlinear distortion controller, based on at least the band input signal, and a selector configured to select, as the output of the band distortion corrector, the signal obtained by performing the nonlinear distortion correction process on the band input signal when the maximum output value calculated by the maximum value calculating section does not exceed a predetermined threshold, and select, as the output of the distortion corrector, the signal obtained by performing the nonlinear distortion correction process on the attenuated input signal generated by an attenuation amount being set in the attenuator so that a level of the attenuated input signal is less than or equal to a predetermined level when the maximum output value calculated by the maximum value calculating section exceeds the predetermined threshold.

Here, in the speaker distortion correction device described above, the predetermined threshold is, for example, a maximum value of the output of the amplifier at which it is guaranteed that no abnormality of the speaker occurs. The predetermined level is a level of the attenuated input signal at which it is guaranteed that no abnormality of the speaker occurs when the signal obtained by the nonlinear distortion controller performing the nonlinear distortion correction process on the attenuated input signal is input to the amplifier. The abnormality of the speaker includes clipping of the output of the speaker, destruction occurrence, and a bottom contact.

Additionally, the speaker distortion correction device in which the plurality of band distortion correctors described above are not provided may include a displacement detector configured to detect displacement of the vibration system of the speaker, and the nonlinear distortion controller may include a nonlinear part correction filter, a linear inverse filter, and an adapting algorithm executing section. A target signal, which is a signal on which the nonlinear distortion correction process is performed, is input to the nonlinear part correction filter and a transfer characteristic for correcting distortion due to a nonlinear characteristic of the speaker with respect to the target signal is set in the nonlinear part correction filter. An output of the nonlinear part correction filter is input to the linear inverse filter. The adaptive algorithm executing section is configured to adapt a transfer function of the linear inverse filter so that the displacement detected by the displacement detector becomes a displacement having no distortion with respect to the target signal.

Additionally, the distortion correction device in which the plurality of band distortion corrector described above are provided may include a displacement detector configured to detect a displacement signal indicating displacement of the vibration system of the speaker, and a displacement signal band divider configured to divide the displacement signal into a plurality of band displacement signals for a plurality of bands and output the plurality of band displacement signals to the plurality of band distortion correctors corresponding to the plurality of bands. The nonlinear distortion controller may include a nonlinear part correction filter, a linear inverse filter, and an adapting algorithm executing section. A target signal, which is a signal on which the nonlinear distortion correction process is performed, is input to the nonlinear part correction filter and a transfer characteristic for correcting distortion due to a nonlinear characteristic of the speaker with respect to the target signal is set in the nonlinear part correction filter. An output of the nonlinear part correction filter is input to the linear inverse filter. The adaptive algorithm executing section is configured to adapt a transfer function of the linear inverse filter so that the band displacement signal becomes a displacement signal having no distortion with respect to the target signal.

The speaker distortion correction device in which the plurality of band distortion correctors described above are not provided may be configured such that the maximum value calculating section calculates, as the maximum output value, a maximum value of a signal obtained by multiplying a signal, obtained by performing a process the same as the nonlinear distortion correction process on the input signal, by the gain of the amplifier.

Alternatively, the maximum value calculating section may calculate the maximum output value from the maximum value of the input signal in accordance with a preset relationship between the maximum value of the input signal and the maximum output value. Alternatively, the maximum value calculating section may obtain the maximum displacement value of the vibration system of the speaker by applying the input signal to an equivalent model of a linear speaker from which the nonlinear characteristic of the speaker is excluded and calculate the maximum output value from the obtained maximum displacement value in accordance with a preset relationship between the maximum displacement value and the maximum output value.

According to the speaker distortion correction device as described above, when the maximum output value of the amplifier for the speaker to be obtained when the signal corrected by performing the nonlinear distortion control process on the input signal is input to the amplifier is not so great as to cause the abnormality of the speaker to occur, the signal corrected by performing the nonlinear distortion control process on the input signal is output to the amplifier, so that the appropriate distortion correction of the speaker can be performed.

Additionally, when the maximum output value of the amplifier for the speaker to be obtained when the signal corrected by performing the nonlinear distortion control process on the input signal is input is great enough to cause the abnormality of the speaker to occur, the input signal on which the nonlinear distortion control process is not performed or the signal obtained by performing the nonlinear distortion control process on the attenuated input signal is input to the amplifier, instead of a signal significantly increased by the nonlinear distortion control process performed on the input signal, thereby suppressing the output of the amplifier from increasing excessively and causing the abnormality of the speaker to occur.

Additionally, the plurality of band distortion correctors are provided and such control for each band is performed, thereby suppressing the distortion factor of the speaker to a lower level in all bands.

As described above, according to the present disclosure, the nonlinear distortion of the speaker can be corrected as much as possible while suppressing the occurrence of the abnormality of the speaker.

In the following, the embodiment of the present invention will be described in detail. FIG. 1 illustrates a configuration of a sound system according to the embodiment. As illustrated, the sound system includes a controller 1, a speaker 2, a sensor 3 provided in the speaker 2, an amplifier 4 configured to drive the speaker 2 by a signal So, a sound source device 5 configured to output a sound source output signal Si as an audio signal, a protecting nonlinear distortion controller 6, and a displacement measuring section 7 configured to measure the displacement of the vibration system of the speaker 2 from the sensor 3.

Figure 2A:
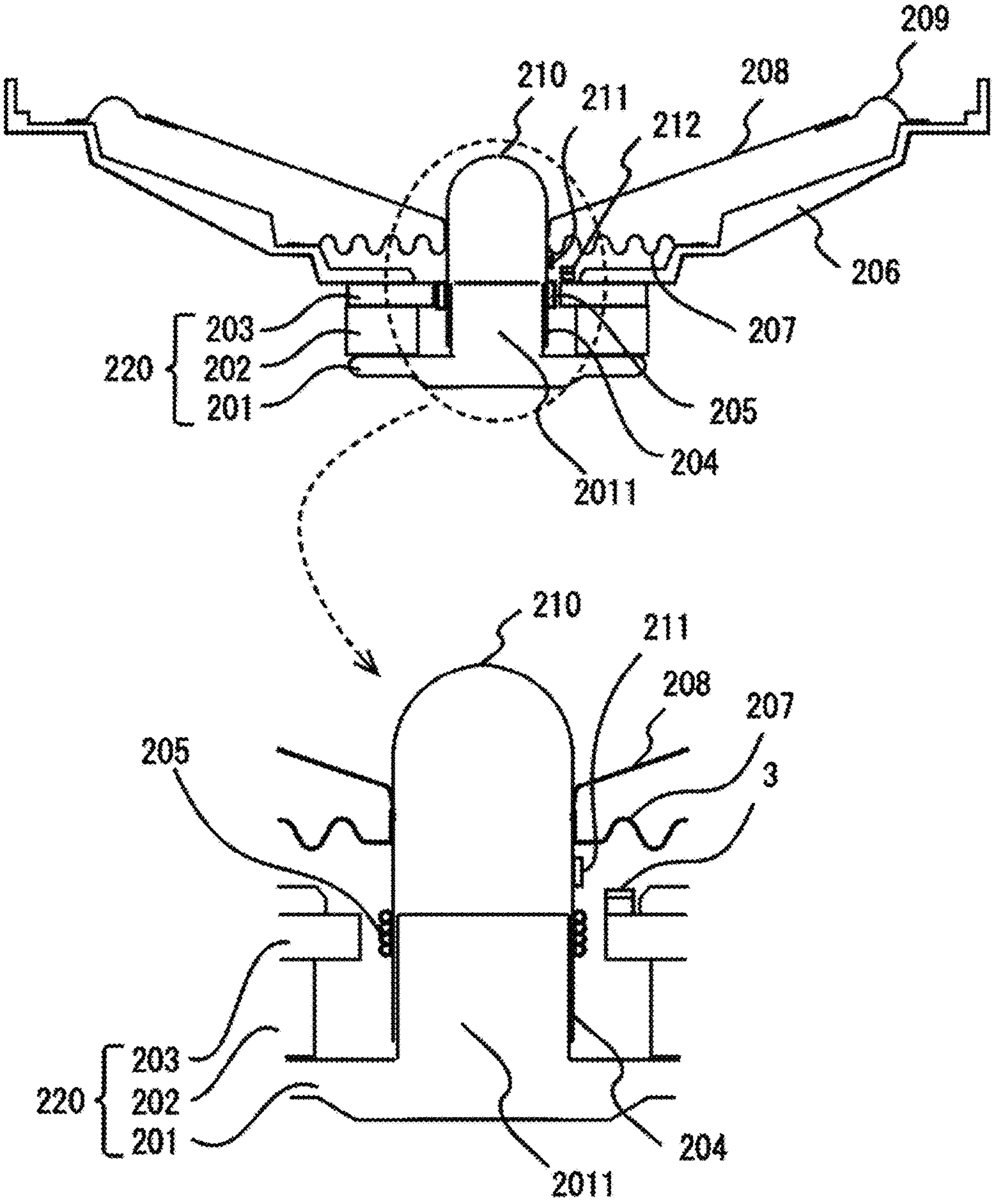
FIG. 2A is a diagram illustrating a configuration of a speaker according to the embodiment of the present disclosure.
Figure 2B:
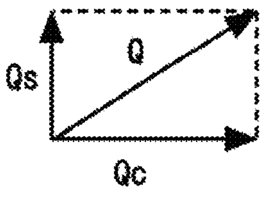
FIG. 2B is a diagram illustrating a magnetic angle.

The protecting nonlinear distortion controller 6 corrects the sound source output signal Si output by the sound source device 5 and outputs the corrected signal to the amplifier 4 as an intermediate output signal ISo. Additionally, the controller 1 also receives, from the sound source device 5, a playback state such as a state in which a song is being played back or a state in which a song is not being played back, information on audio content being played back, information on an output level (a volume or the like), and the like. Next, FIG. 2A illustrates a configuration of the speaker 2. As illustrated, the speaker 2 includes a yoke 201, a magnet 202, a top plate 203, a voice coil bobbin 204, a voice coil 205, a frame 206, a damper 207, a diaphragm 208, an edge 209, a dust cap 210, and a displacement detection magnet 211. Assuming that the upper side of the drawing is the front side of the speaker 2 and the lower side of the drawing is the rear side of the speaker 2, the yoke 201 has a protrusion 2011 protruding forward at the center, the annular magnet 202 is provided on the outer periphery of the protrusion 2011, and the annular top plate 203 is provided on the magnet 202. The top plate 203 is made of a member having conductivity, such as iron. The yoke 201, the magnet 202, and the top plate 203 form a magnetic circuit 220.

The voice coil bobbin 204 has a hollow cylindrical shape, and the voice coil 205 to which a signal from the amplifier 4 is applied is wound around the outer periphery of the voice coil bobbin 204. Additionally, the protrusion 2011 of the yoke 201 is inserted into the hollow of the voice coil bobbin 204 from the rear side such that the voice coil bobbin 204 is movable forward and backward with respect to the yoke 201, and the voice coil 205 is disposed between the protrusion 2011 of the yoke 201 and the top plate 203 at a position where the magnetic flux generated by the magnetic circuit 220 between the inner peripheral ends of the top plate 203 passes through.

The diaphragm 208 has a shape substantially the same as a side surface of a truncated cone whose height direction is substantially the front-rear direction of the speaker 2, and an outer peripheral end of the diaphragm is connected to a front end of the frame 206 at the edge 209. Additionally, the inner peripheral end of the diaphragm 208 is fixed to a front end of the voice coil bobbin 204.

In such a configuration of the speaker 2, when the output signal So from the amplifier 4 is applied to the voice coil 205, the voice coil bobbin 204 vibrates backward and forward in accordance with the amplitude of the output signal So by the electromagnetic action between the magnetic flux generated from the magnetic circuit 220 and the signal flowing through the voice coil 205. When the voice coil bobbin 204 vibrates, the diaphragm 208 connected to the voice coil bobbin 204 vibrates, and a sound corresponding to the signal from the amplifier 4 is generated.

The displacement detection magnet 211 is fixed to the outer peripheral side of the voice coil bobbin 204 so as to move up and down together with the voice coil bobbin 204, and generates a magnetic flux in a direction orthogonal to the magnetic flux generated by the magnetic circuit 220. Additionally, the sensor 3 described above is fixed to a non-vibrating system of the speaker 2, such as the top plate 203, at a position close to the displacement detection magnet 211. The sensor 3 is a magnetic angle sensor, and, as illustrated in 2B, detects and outputs, as a magnetic angle, an arctangent Qs/Qc of an angle of a resultant vector Q of a flux vector Qc acting from the magnetic circuit 220 and a flux vector Qs acting from the displacement detection magnet 211. Because the magnetic flux vector generated by the displacement detection magnet 211 that acts on the sensor 3 changes due to the displacement of the displacement detection magnet 211 caused by the displacement of the voice coil bobbin 204, the magnetic angle has a value corresponding to the displacement amount of the voice coil bobbin 204.

Figure 3:
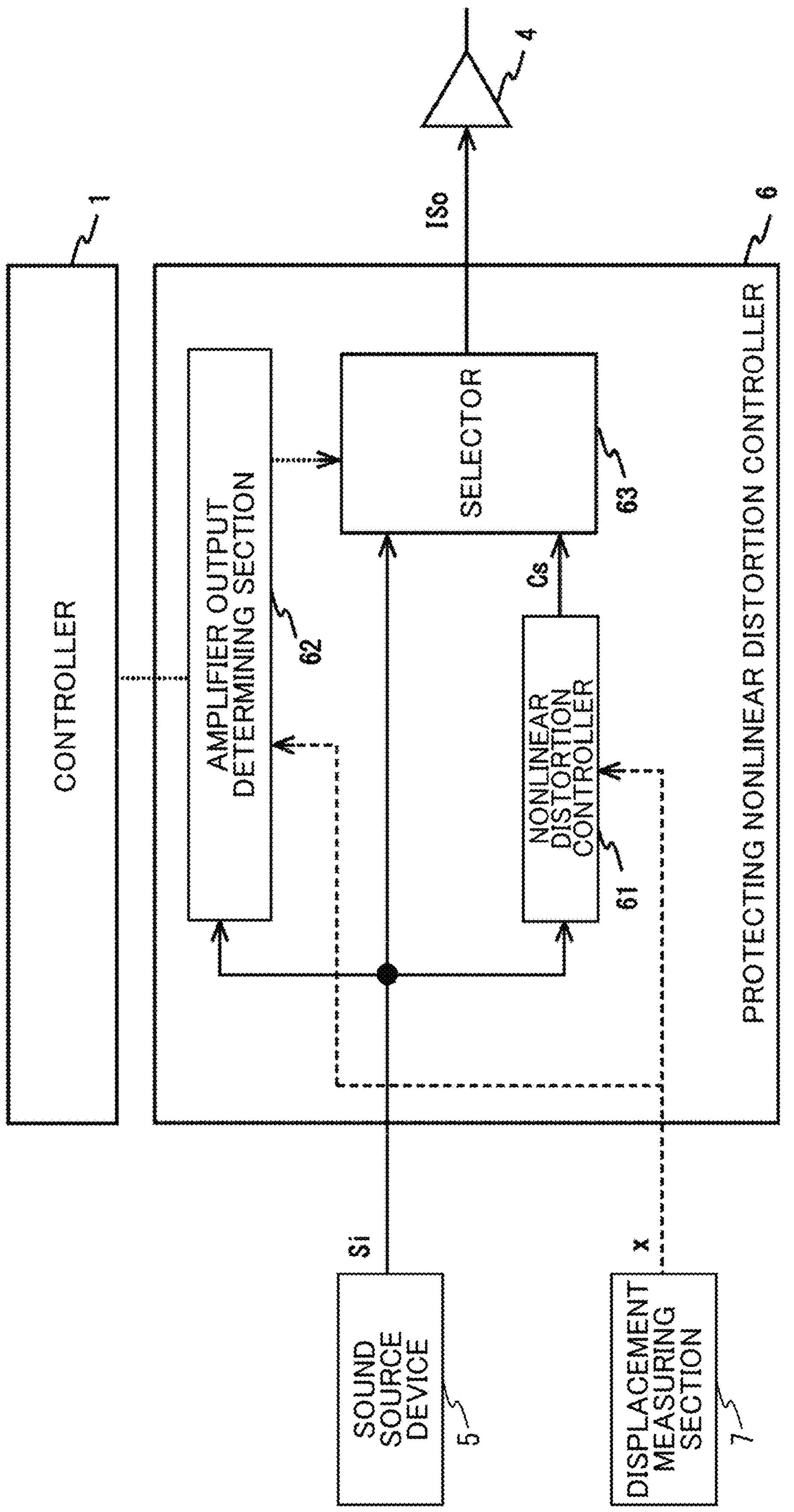
FIG. 3 is a diagram illustrating a configuration of a protecting nonlinear distortion controller according to the embodiment of the present disclosure.
Figure 4:
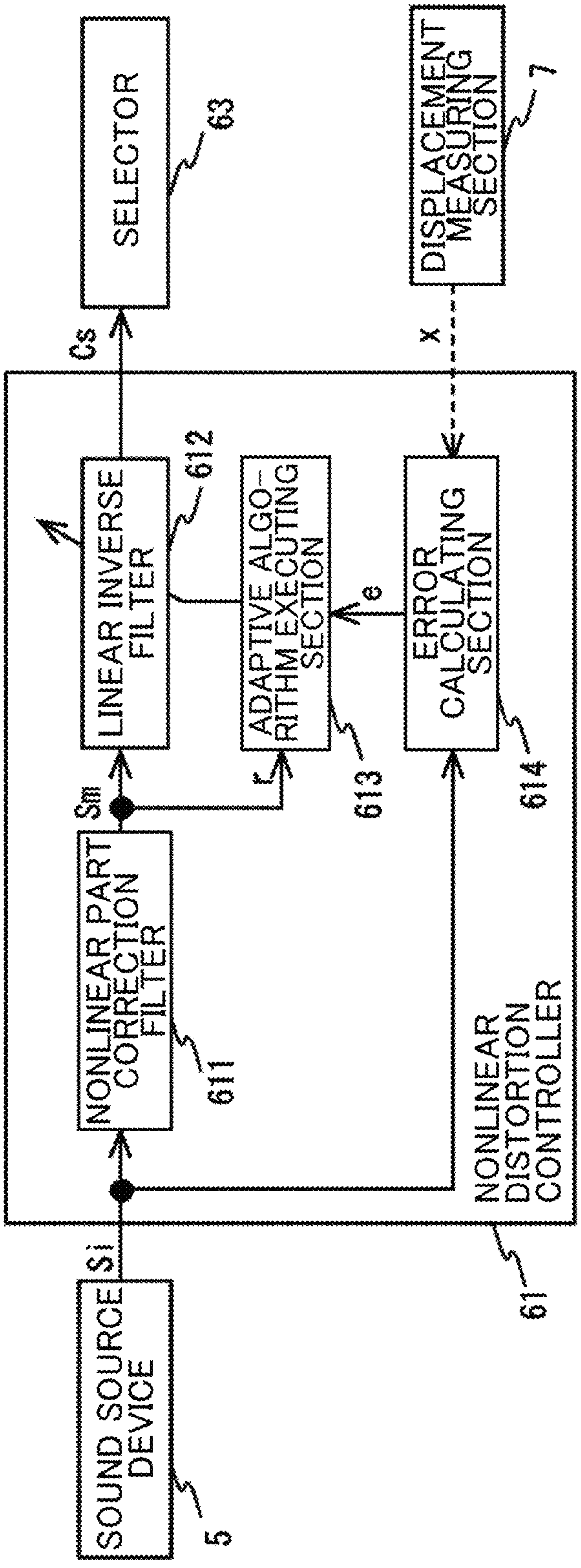
FIG. 4 is a diagram illustrating a configuration of a nonlinear distortion controller according to the embodiment of the present disclosure.

As illustrated in FIG. 1, the displacement measuring section 7 measures the displacement of the vibration system of the speaker 2 from the output of the sensor 3, and outputs the displacement as a displacement signal x to the controller 1 and the protecting nonlinear distortion controller 6. Next, FIG. 3 illustrates a configuration of the protecting nonlinear distortion controller 6. As illustrated, the protecting nonlinear distortion controller 6 includes a nonlinear distortion controller 61 configured to receive the sound source output signal Si and the displacement signal x, an amplifier output determining section 62 configured to receive the sound source output signal Si and the displacement signal x, and a selector 63 configured to select either the sound source output signal Si or a corrected signal Cs output from the nonlinear distortion controller 61 and output the selected signal to the amplifier 4 as the intermediate output signal ISo. Here, the protecting nonlinear distortion controller 6 is an example of the distortion corrector, the nonlinear distortion controller 61 is an example of the nonlinear distortion controller, and the amplifier output determining section 62 is an example of the maximum value calculating section. The nonlinear distortion controller 61 performs a distortion correction operation while referring to the displacement signal x of the sensor 3. The distortion correction operation corrects the sound source output signal Si so as to eliminate distortion of the output of the speaker 2 with respect to the sound source output signal Si due to the nonlinear characteristic and the linear characteristic of the speaker 2, and outputs the corrected signal to the selector 63 as the corrected signal Cs. Here, a configuration example of the nonlinear distortion controller 61 performing such a distortion correction operation is illustrated in FIG. 4. As illustrated, the nonlinear distortion controller 61 includes a nonlinear part correction filter 611, a linear inverse filter 612, an adaptive algorithm executing section 613, and an error calculating section 614. The sound source output signal Si output by the sound source device 5 is input to the linear inverse filter 612 as an intermediate correction signal Sm through the nonlinear part correction filter 611, and is output to the selector 63 as the corrected signal Cs through the linear inverse filter 612. The transfer characteristic (the filter coefficient) of the nonlinear part correction filter 611 is set to a transfer characteristic that cancels distortion of the output of the speaker 2 due to the nonlinear characteristic of the speaker 2 with respect to the sound source output signal Si when the speaker 2 is driven by the intermediate correction signal Sm output by the nonlinear part correction filter 611, that is, a transfer characteristic that corrects distortion due to the nonlinear characteristic of the speaker 2.

The error calculating section 614 calculates a difference between the displacement (vibration) of the speaker 2 without distortion with respect to the sound source output signal Si and the actual displacement (vibration) of the speaker 2 indicated by the displacement signal x of the sensor 3. The adaptive algorithm executing section 613 and the linear inverse filter 612 constitute an adaptive filter, and the adaptive algorithm executing section 613 updates the transfer characteristic (filter coefficient) of the linear inverse filter 612, which is an FIR filter or the like, to minimize the error e by the LMS algorithm or the like, with the intermediate correction signal Sm as a reference signal r and the difference calculated by the error calculating section 614 as error e.

As a result of the updating, the transfer characteristic for correcting the distortion of the output of the speaker 2 with respect to the sound source output signal Si due to the nonlinear characteristic of the speaker 2 is set in the linear inverse filter 612. Returning to FIG. 3, the amplifier output determining section 62 performs a maximum amplifier output value calculation process and a nonlinear control suppression process. The maximum amplifier output value calculation process calculates a maximum amplifier output value, which is a maximum value of the output of the amplifier 4 to be obtained when a signal, corrected by performing the distortion correction operation on the sound source output signal Si in the nonlinear distortion controller 61 based on the sound source output signal Si and the displacement signal x of the sensor 3, is input to the amplifier 4.

Figure 5:
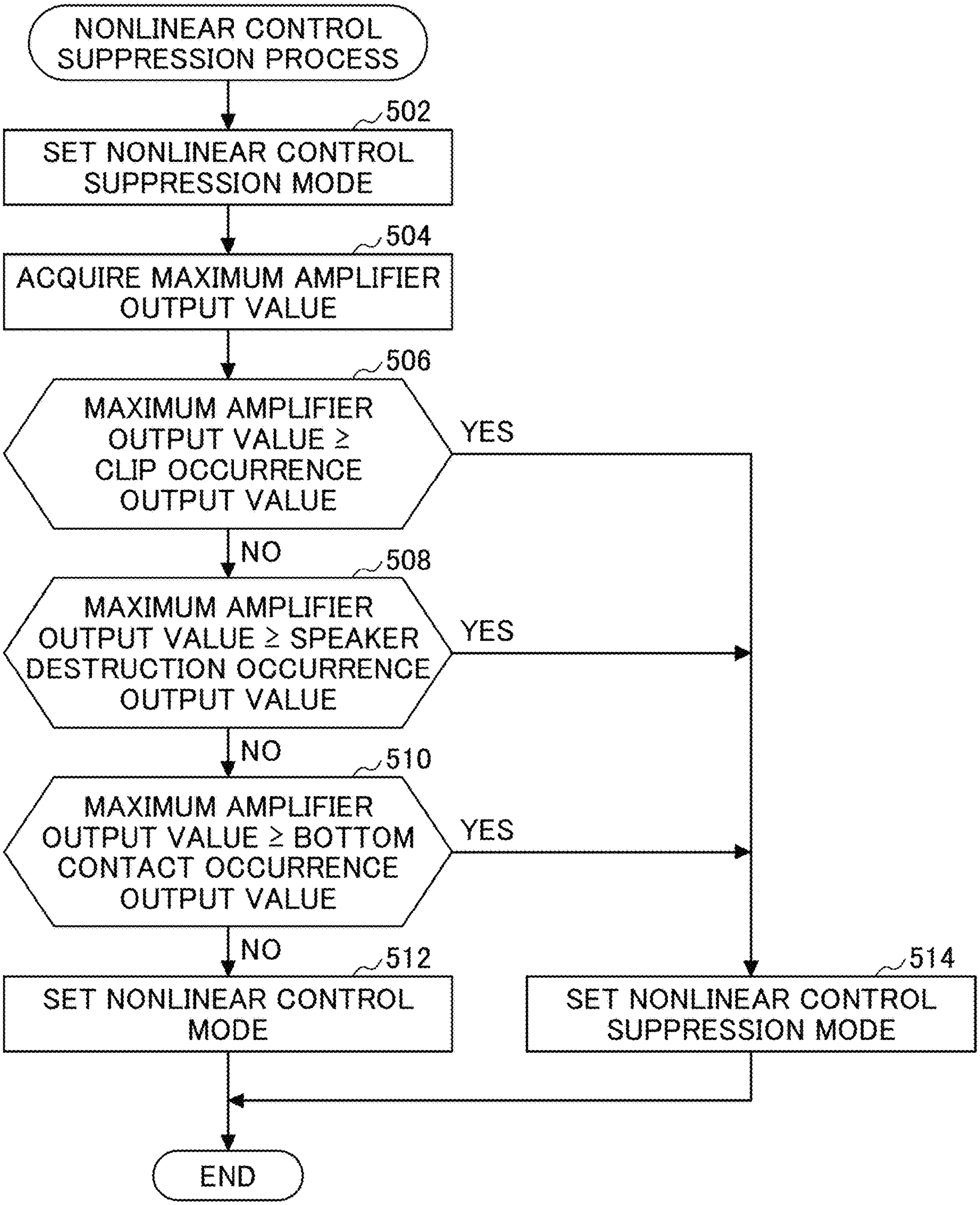
FIG. 5 is a flowchart illustrating a nonlinear control suppression process according to the embodiment of the present disclosure.

The details of the maximum amplifier output value calculation process will be described later. First, the nonlinear control suppression process will be described. FIG. 5 illustrates a procedure of the nonlinear control suppression process. The nonlinear control suppression process may always be performed repeatedly or may be performed periodically. The controller 1 may cause the amplifier output determining section 62 to perform the nonlinear control suppression process in response to a predetermined trigger. In the case of performing the process in response to a predetermined trigger, as the trigger, the timing of the initialization of the sound system, the timing of the activation of the sound system, the timing of the change in the output level (volume) of the sound source device 5, the timing of the change in the content being played back by the sound source device 5, or the like is used.

As illustrated, first, the nonlinear control suppression process sets the nonlinear control suppression mode (step 502). Here, the nonlinear control suppression mode is a mode in which the selector 63 is caused to output the sound source output signal Si to the amplifier 4 as the intermediate output signal ISo. Next, the maximum amplifier output value calculated in the maximum amplifier output value calculation process is acquired (step 504). Then, it is determined whether the maximum amplifier output value is greater than or equal to a clip occurrence output value, which is a minimum value of the output of the amplifier 4 at which clipping of the output can occur in the speaker 2 (step 506). It is determined whether the maximum amplifier output value is greater than or equal to a speaker destruction occurrence output value, which is a minimum value of the output of the amplifier 4 at which damage can occur in the speaker 2 (step 508). It is determined whether the maximum amplifier output value is greater than or equal to a bottom contact occurrence output value, which is a minimum value of the output of the amplifier 4 at which bottom contact of the vibration system can occur in the speaker 2 (step 510).

Here, the clip occurrence output value, the speaker destruction occurrence output value, and the bottom contact occurrence output value are previously examined and set in the amplifier output determining section 62. Then, if the maximum amplifier output value is not greater than or equal to the clip occurrence output value, the speaker destruction occurrence output value, or the bottom contact occurrence output value, a nonlinear control mode is set (step 512), and the process is ended. Here, the nonlinear control mode is a mode in which the selector 63 is caused to output the corrected signal Cs output by the nonlinear distortion controller 61 to the amplifier 4 as the intermediate output signal ISo. If the maximum amplifier output value is greater than or equal to any one of the clip occurrence output value, the speaker destruction occurrence output value, or the bottom contact occurrence output value, the nonlinear control suppression mode is set (step 514), and the process is ended. According to the nonlinear control suppression process described above, when the maximum value of the output signal So output from the amplifier 4 to the speaker 2 when the signal corrected by the nonlinear distortion controller 61 performing the distortion correction operation on the sound source output signal Si is input to the amplifier 4 is not so great as to cause an abnormality of the speaker 2 such as clipping of the output of the speaker 2, damage of the speaker 2, or a bottom contact of the speaker 2, the corrected signal Cs, which is the signal corrected by the nonlinear distortion controller 61 performing the distortion correction operation on the sound source output signal Si, is output to the amplifier 4 as the intermediate output signal ISo, so that the appropriate distortion correction of the speaker 2 can be performed.

If the maximum value of the output signal So output from the amplifier 4 to the speaker 2 when the signal corrected by the nonlinear distortion controller 61 performing the distortion correction operation on the sound source output signal Si is input to the amplifier 4 is great enough to cause an abnormality of the speaker 2, the sound source output signal Si is output to the amplifier 4 as the intermediate output signal ISo, thereby suppressing the occurrence of an abnormality of the speaker 2 due to an excessive increase of the output of the amplifier 4 by the corrected signal Cs significantly increased by the nonlinear distortion controller 61 performing the distortion correction operation on the sound source output signal Si.

Here, the reason why the nonlinear control suppression mode is set in step 502 is to prevent clipping, damage to the speaker 2, and a bottom contact from occurring before the nonlinear control suppression process is completed. Additionally, in the determination in steps 506 to 510 of the nonlinear control suppression process, the minimum value among the clip occurrence output value, the speaker destruction occurrence output value, and the bottom contact occurrence output value may be used as a reference output, and the process may proceed to step 514 when the maximum amplifier output value is greater than or equal to the reference output, and the process may proceed to step 512 otherwise. Additionally, in the above description, the selector 63 is caused to output the sound source output signal Si to the amplifier 4 as the intermediate output signal ISo in the nonlinear control suppression mode. But, a filter for performing some processing other than the correction of the nonlinear distortion on the sound source output signal Si may be provided in the protecting nonlinear distortion controller 6, and the selector 63 may be caused to output the signal processed by the filter to the amplifier 4 as the intermediate output signal ISo in the nonlinear control suppression mode.

Next, the maximum amplifier output value calculation process performed by the amplifier output determining section 62 will be described. The maximum amplifier output value calculation process is performed when the amplifier output determining section 62 starts the nonlinear control suppression process, and the amplifier output determining section 62 waits for the maximum amplifier output value with respect to the sound source output signal Si for a predetermined period of time to be calculated in the maximum amplifier output value calculation process and acquires the maximum amplifier output value in step 504 of the nonlinear control suppression process.

Figure 6A:
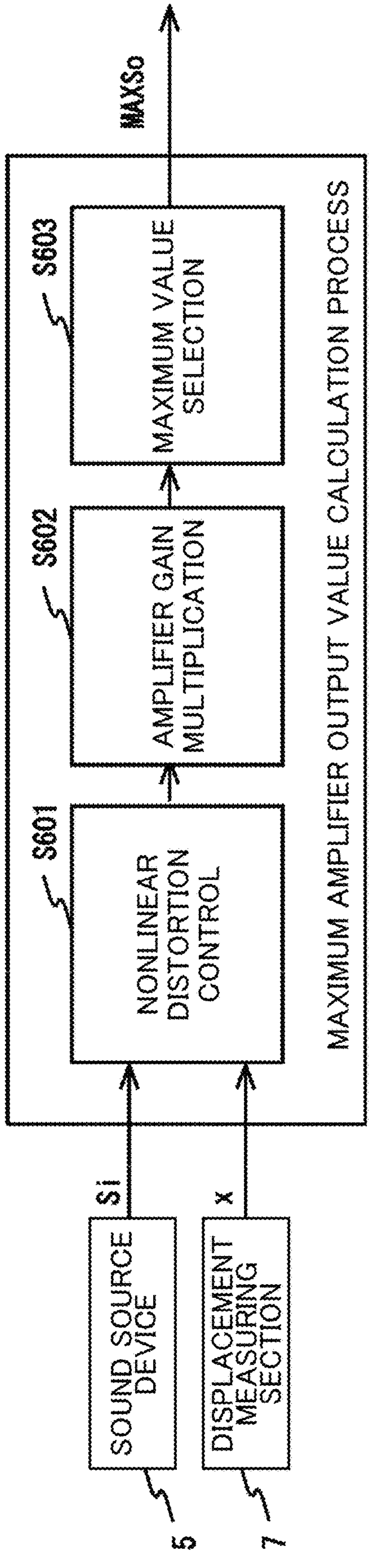
FIG. 6A is a diagram illustrating a configuration of a maximum amplifier output value detection process according to the embodiment of the present disclosure.

As illustrated in FIG. 6A, in the maximum amplifier output value calculation process, the amplifier output determining section 62 performs nonlinear distortion control S601 to correct the sound source output signal Si by an operation the same as the distortion correction operation of the nonlinear distortion controller 61, using the sound source output signal Si and the displacement signal x of the sensor 3. Then, the amplifier output determining section 62 performs amplifier gain multiplication S602 to multiply the signal corrected in the nonlinear distortion control S601 by a value of the gain of the amplifier 4. Then, the amplifier output determining section 62 performs maximum value selection S603 to set the maximum value of the signal on which the amplifier gain multiplication S602 has been performed in a predetermined period of time in the immediate past as a maximum amplifier output value MAXSo.

If the value of the gain of the amplifier 4 is known from a set value, a design value, or the like, the known value is used. If the value of the gain of the amplifier 4 is not known, a predetermined test signal u (for example, a sinusoidal wave of 20 Hz) is output to the amplifier 4 in advance and the gain value is calculated. The test signal u can be output to the amplifier 4 by setting the nonlinear control suppression mode and then causing the sound source device 5 to output the test signal u as the sound source output signal Si. Additionally, the gain of the amplifier 4 can be calculated by solving the following equation according to an equivalent circuit of the speaker 2 illustrated in FIG. 6B that is set in advance, with respect to a gain value A by using the test signal u and the displacement signal x of the sensor 3. In the following equation, x is time-series data, and x(i) represents the i-th data of the displacement signal x. Additionally, the test signal u is time-series data, and u(i) represents the i-th data of the test signal u. Additionally, $F_s$ is a sampling frequency of the time-series data.

$$X(n) = -a_1x(n-1) - a_2x(n-2) - a_3x(n-3) + \{b_0u(n) + b_1u(n-1) + b_2u(n-2) + b_3u(n-3)\}A$$

$$a_0 = R_eK_{ms} + 2F_s\left(R_eR_{ms} + L_eK_{ms} + B1^2\right) + 4F_s^2(R_eM_{ms} + L_eR_{ms}) + 8F_s^3(M_{ms}L_e)$$

$$a_1 = \left\{3R_eK_{ms} + 2F_s\left(R_eR_{ms} + L_eK_{ms} + B1^2\right)4F_s^2(R_eM_{ms} + L_eR_{ms})24F_s^3(M_{ms}L_e)\right\}/a_0$$

$$a_2 = \left\{3R_eK_{ms}2F_s\left(R_eR_{ms} + L_eK_{ms} + B1^2\right)4F_s^2(R_eM_{ms} + L_eR_{ms}) + 24F_s^3(M_{ms}L_e)\right\}/a_0$$

$$a_3 = \left\{R_eK_{ms}2F_s\left(R_eR_{ms} + L_eK_{ms} + B1^2\right) + 4F_s^2(R_eM_{ms} + L_eR_{ms})8F_s^3(M_{ms}L_e)\right\}/a_0$$

$$b_0 = B1/a_0$$

$$b_1 = 3B1/a_0$$

$$b_2 = 3B1/a_0$$

$$b_3 = B1/a_0$$

The embodiment of the present invention has been described above.

Figure 7:
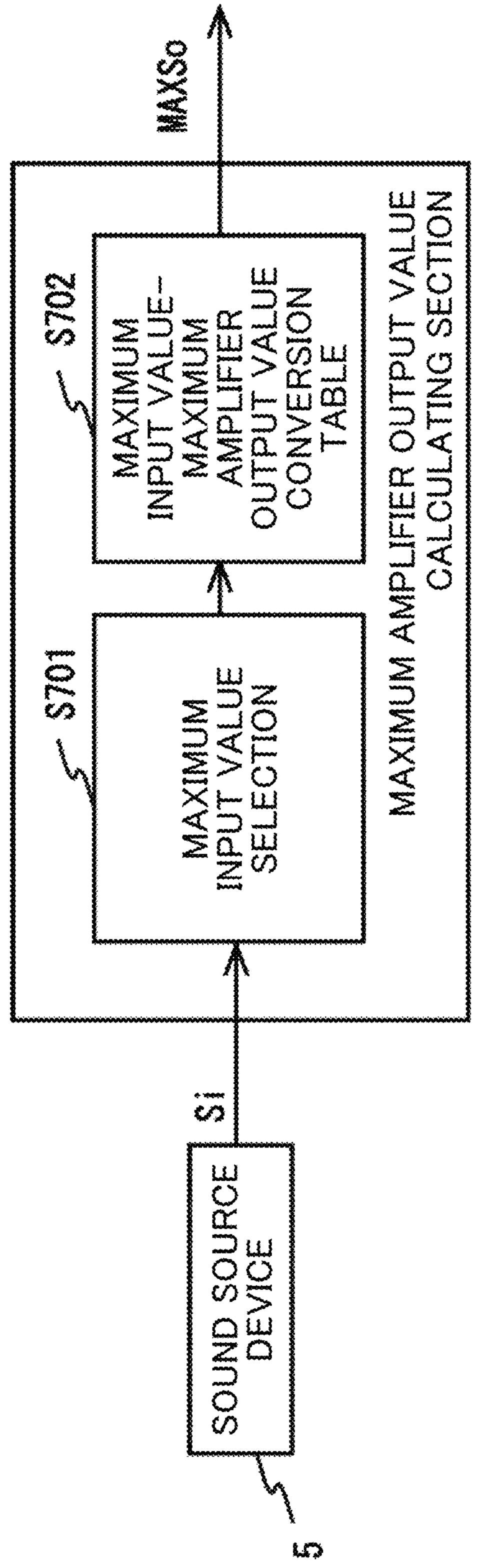
FIG. 7 is a diagram illustrating another configuration example of the maximum amplifier output value detection process according to the embodiment of the present disclosure.

Here, the maximum amplifier output value calculation process of the amplifier output determining section 62 in the above embodiment may be performed as illustrated in FIG. 7. That is, a relationship between the maximum value of the sound source output signal Si and the maximum value of the signal So output from the amplifier 4 to the speaker 2 when the signal corrected by the nonlinear distortion controller 61 performing the distortion correction operation on the sound source output signal Si is input to the amplifier 4 is examined in advance, and a maximum input value-maximum amplifier output value conversion table S702 indicating the relationship is prepared in advance. Then, in the maximum amplifier output value calculation process, maximum input value selection S701 is performed to select the maximum value of the sound source output signal Si in a predetermined period of time in the immediate past as the maximum input value, and the selected maximum input value is converted into the maximum amplifier output value MAXSo by using the maximum input value-maximum amplifier output value conversion table S702.

Figure 8A:
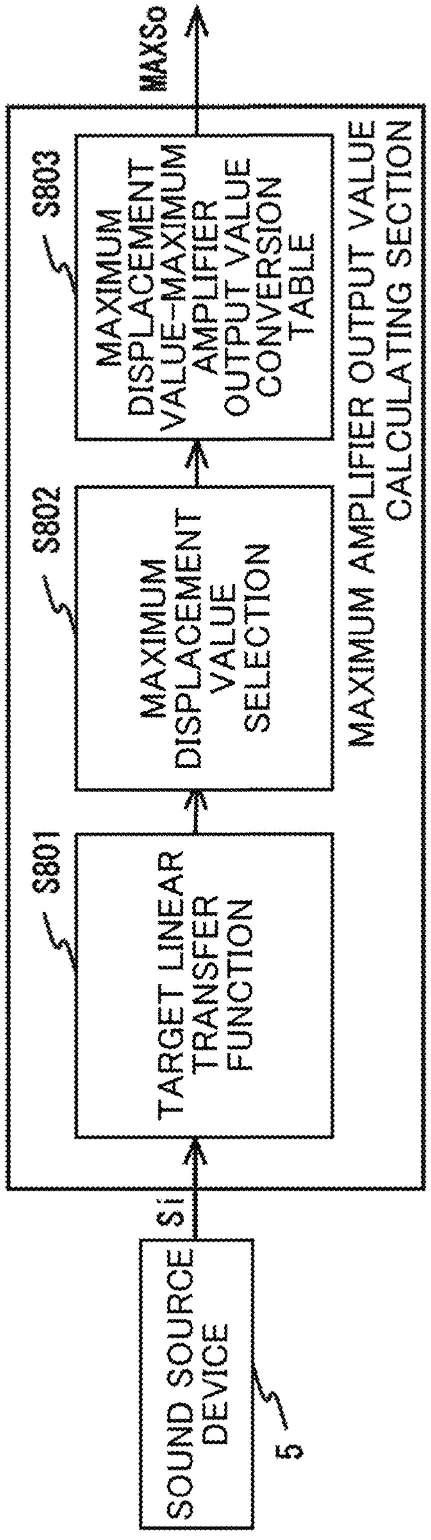
FIG. 8A is a diagram illustrating another configuration example of the maximum amplifier output value detection process according to the embodiment of the present disclosure.

Here, when the maximum amplifier output value calculation process is performed as illustrated in FIG. 7, the displacement signal x of the sensor 3 need not be input to the amplifier output determining section 62. Alternatively, the maximum amplifier output value calculation process of the amplifier output determining section 62 in the above embodiment may be performed as illustrated in FIG. 8A. That is, a linear transfer function from the designed sound source output signal Si to the displacement of the speaker 2, which is realized by the distortion correction operation of the nonlinear distortion controller 61, is prepared in advance as a target linear transfer function S801. Additionally, a relationship between the maximum value of the displacement of the speaker 2 and the maximum value of the output signal So output from the amplifier 4 to the speaker 2 when the signal corrected by the nonlinear distortion controller 61 performing the distortion correction operation on the sound source output signal Si is input is examined in advance, and a maximum displacement value-maximum amplifier output value conversion table S803 indicating the relationship is prepared in advance.

Then, the target linear transfer function S801 has been applied to the sound source output signal Si in the predetermined period of time in the immediate past to convert the signal into the displacement, maximum displacement value selection S802 is performed to select the maximum value of the converted displacement as the maximum displacement value, and the selected maximum displacement value is converted into the maximum amplifier output value MAXSo by using the maximum displacement value-maximum amplifier output value conversion table S803.

Figure 8B:
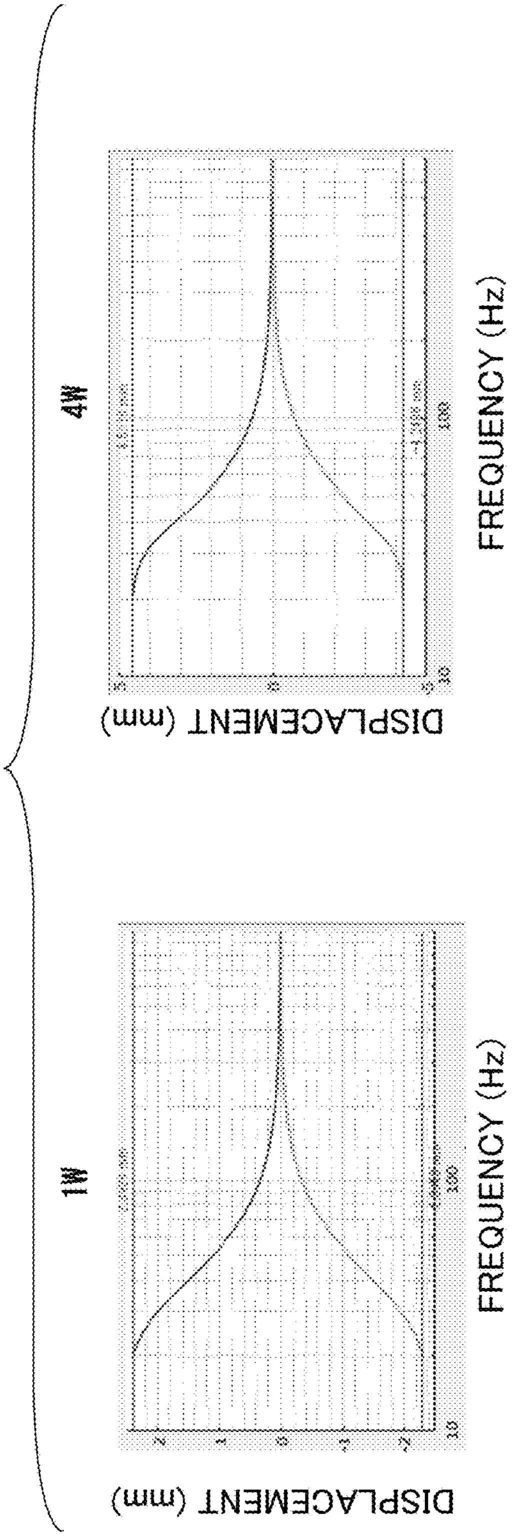
FIG. 8B is graphs indicating a frequency characteristic of displacement of the speaker.

Here, the maximum displacement value-maximum amplifier output value conversion table S803 may be calculated as follows, for example. By solving the following differential equation according to the equivalent circuit of the speaker 2 illustrated in FIG. 6B for each output (W; watt) of the amplifier 4, for the displacement x, using a pure tone of each frequency of the output as an input u (t), the frequency characteristic of the displacement of the speaker 2 is obtained for each output of the amplifier 4 as illustrated in FIG. 8B.

$$R_e^i + L_e\frac{di}{dt} + Bl(x)\frac{dx}{dt} = u(t) \qquad \text{[Eq. 1]}$$

$$M_{ms}\frac{d^2x}{dt^2} + R_{ms}\frac{dx}{dt} + K_{ms}(x)x + \frac{1}{2}\frac{\mathrm{dL}_e}{dx}i^2 = Bl(x)i$$

Figure 8C:
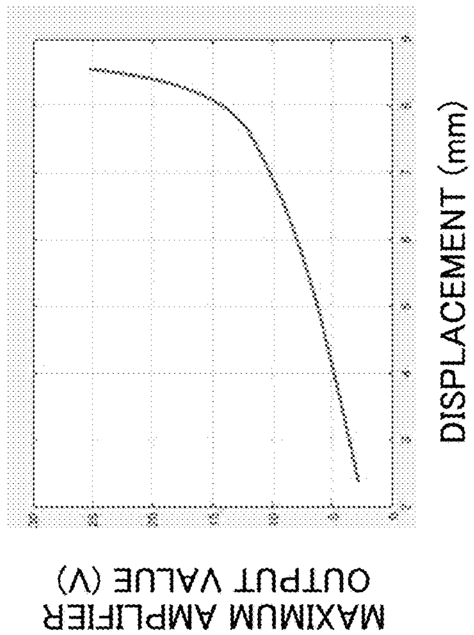
FIG. 8C is a graph indicating a relationship between a displacement maximum value and the maximum amplifier output value.

Then, the maximum value of the displacement of the frequency characteristic is obtained for each output of the amplifier 4, each output (W; watt) of the amplifier 4 is converted into the voltage, and then a relationship between the maximum value of the displacement and the output voltage of the amplifier 4 is obtained as illustrated in FIG. 8C. By approximately using the relationship between the maximum value of the displacement and the output voltage of the amplifier 4 illustrated in FIG. 8C as a relationship between the maximum value of the displacement and the maximum value of the output of the amplifier, the maximum displacement value-maximum amplifier output value conversion table S803 is calculated to represent the relationship.

Figure 9:
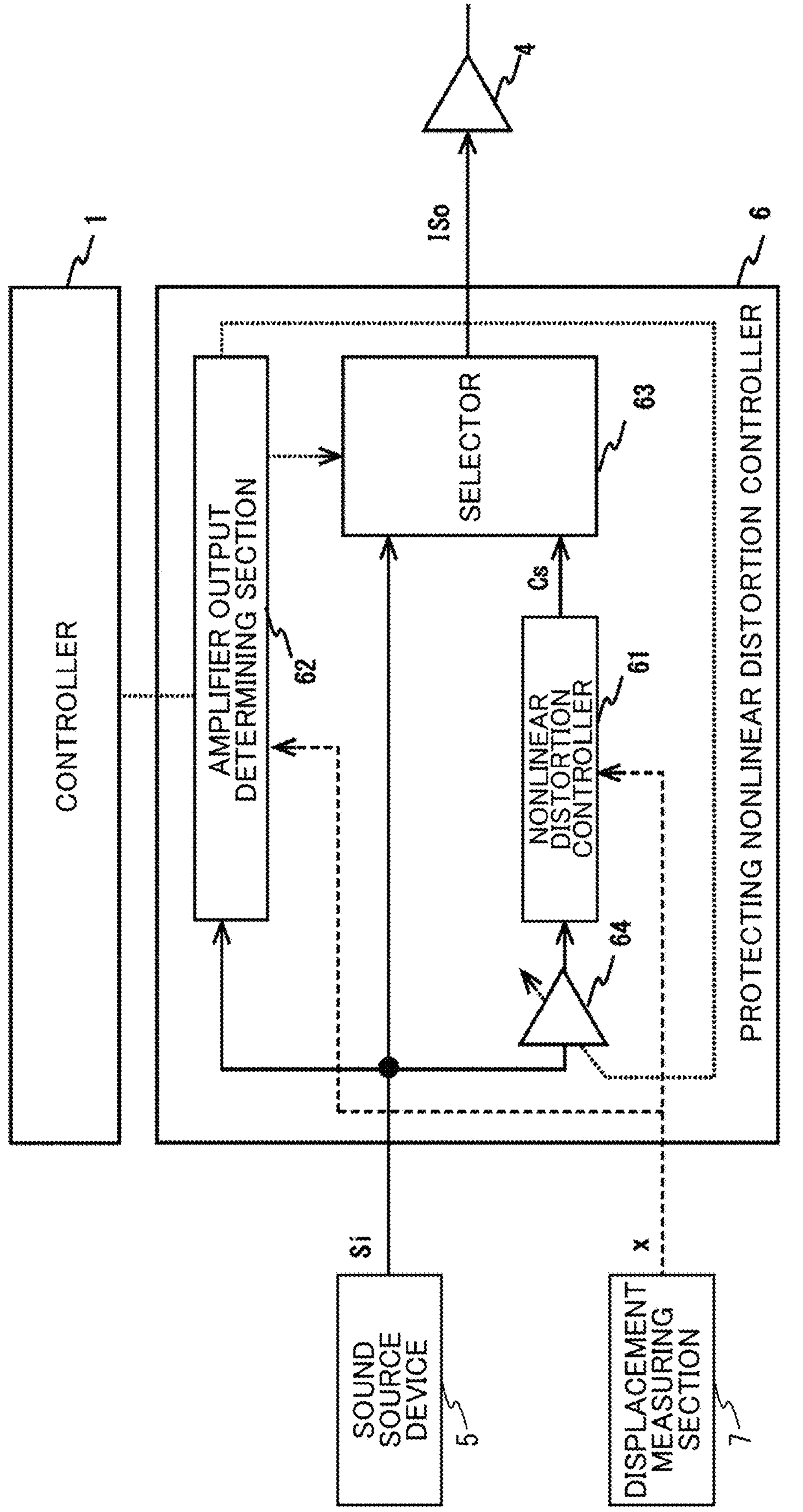
FIG. 9 is a diagram illustrating another configuration example of the protecting nonlinear distortion controller according to the embodiment of the present disclosure.

Here, when the maximum amplifier output value calculation process is performed as illustrated in FIG. 8A, the displacement signal x of the sensor 3 need not be input to the amplifier output determining section 62. Here, instead of the protecting nonlinear distortion controller 6 illustrated in FIG. 3 and the nonlinear control suppression process illustrated in FIG. 5 described in the above embodiment, the protecting nonlinear distortion controller 6 illustrated in FIG. 9 and the nonlinear control suppression process illustrated in FIG. 10 may be used. The protecting nonlinear distortion controller 6 illustrated in FIG. 9 is configured such that the sound source output signal Si is input to the nonlinear distortion controller 61 of the protecting nonlinear distortion controller 6 illustrated in FIG. 3 via an attenuator 64. The attenuator 64 is a variable attenuator whose attenuation amount is variable from 0 to a predetermined amount, and is provided such that the attenuation amount can be controlled by the amplifier output determining section 62.

Figure 10:
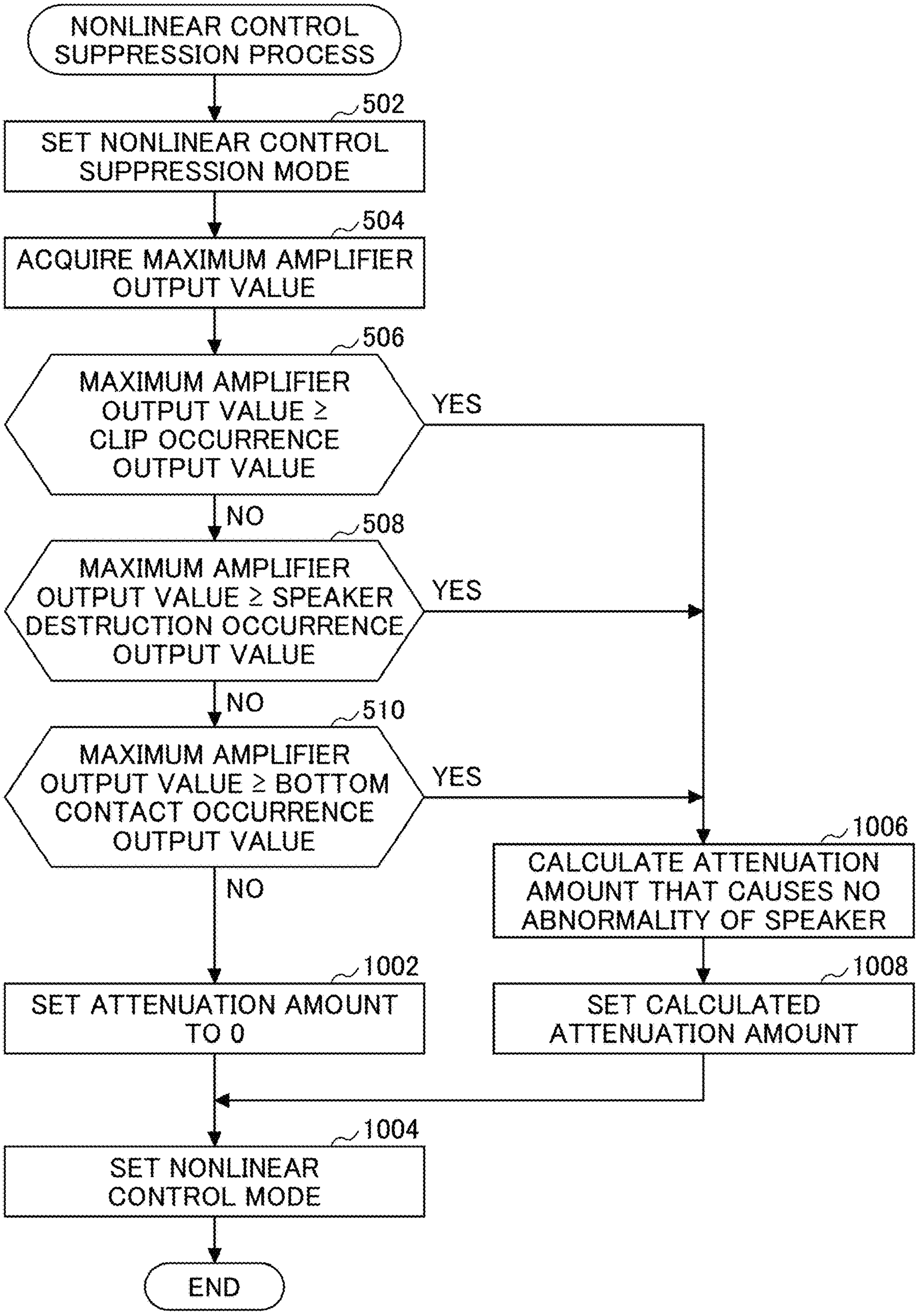
FIG. 10 is a flowchart illustrating another example of the nonlinear control suppression process according to the embodiment of the present disclosure.

Additionally, in the nonlinear control suppression process of FIG. 10, the processing of setting the nonlinear control mode in step 512 of the nonlinear control suppression process of FIG. 5 is replaced with processing of setting the attenuation amount to 0 in the attenuator 64 (step 1002) and then setting the nonlinear control mode (step 1004).

Additionally, in the nonlinear control suppression process of FIG. 10, the processing of setting the nonlinear control suppression mode in step 514 of the nonlinear control suppression process of FIG. 5 is replaced with processing of calculating the attenuation amount of the attenuator 64 for attenuating the sound source output signal Si input to the nonlinear distortion controller 61 (step 1006), setting the calculated attenuation amount in the attenuator 64 (step 1008), and setting the nonlinear control mode (step 1004), so that the maximum value of the output So of the amplifier 4 becomes not greater than or equal to the clipping occurrence output value, the speaker destruction occurrence output value, or the bottom contact occurrence output value, that is, the maximum value of the output So of the amplifier 4 becomes a value at which an abnormality of the speaker 2 does not occur.

Here, for example, the calculating of the attenuation amount of the attenuator 64 in step 1006 can calculate, from the sound source output signal Si, an attenuation amount for attenuating the sound source output signal Si so that a level of the sound source output signal Si is changed to a level of the sound source output signal Si that has been examined and set in advance as a level at which it can be guaranteed that the maximum value of the output So of the amplifier 4 becomes a value at which no abnormality occurs in the speaker 2.

By using the protecting nonlinear distortion controller 6 of FIG. 9 and the nonlinear control suppression process of FIG. 10, the distortion factor can be suppressed to a low level even when the output level of the sound source output signal Si of the sound source device 5 is high. Additionally, instead of the protecting nonlinear distortion controller 6 of FIG. 3 in the embodiment, a protecting nonlinear distortion controller 6 illustrated in FIG. 11 may be used. The protecting nonlinear distortion controller 6 illustrated in FIG. 11 includes a sound source output signal band divider 651, a displacement signal band divider 652, multiple band protecting nonlinear distortion controllers 653, and a mixer 654. Each of the band protecting nonlinear distortion controllers 653 has the same configuration as either the protecting nonlinear distortion controller 6 of FIG. 3 configured to perform the nonlinear control suppression process of FIG. 5 or the protecting nonlinear distortion controller 6 of FIG. 9 configured to perform the nonlinear control suppression process of FIG. 10, and each of the band protecting nonlinear distortion controllers 653 performs the same operation independently. The band protecting nonlinear distortion controllers 653 are respectively provided corresponding to multiple bands obtained by dividing an entire band of the sound source output signal Si. The sound source output signal band divider 651 divides the sound source output signal Si output by the sound source device 5 into bands and outputs the sound source output signal Si of each of the bands to the band protecting nonlinear distortion controller 653 corresponding to the band, and the displacement signal band divider 652 divides the displacement signal x output by the displacement measuring section 7 into bands and outputs the displacement signal x of each of the bands to the band protecting nonlinear distortion controller 653 corresponding to the band.

The signal obtained by performing the above-described process on the sound source output signal Si and the displacement signal x of the corresponding band and output from the band protecting nonlinear distortion controller 653 is output to the mixer 654. The mixer 654 synthesizes the signals input from the respective band protecting nonlinear distortion controllers 653, and outputs the synthesized signal to the amplifier 4 as the intermediate output signal ISo. Here, the table used in the maximum amplifier output value calculation process, the clipping occurrence output value, the speaker destruction occurrence output value, the bottom contact occurrence output value, and the like used in the nonlinear control suppression process in each of the band protecting nonlinear distortion controllers 653 are obtained in advance for each band to match the band, and are set in each of the band protecting nonlinear distortion controller 653.

Figure 11:
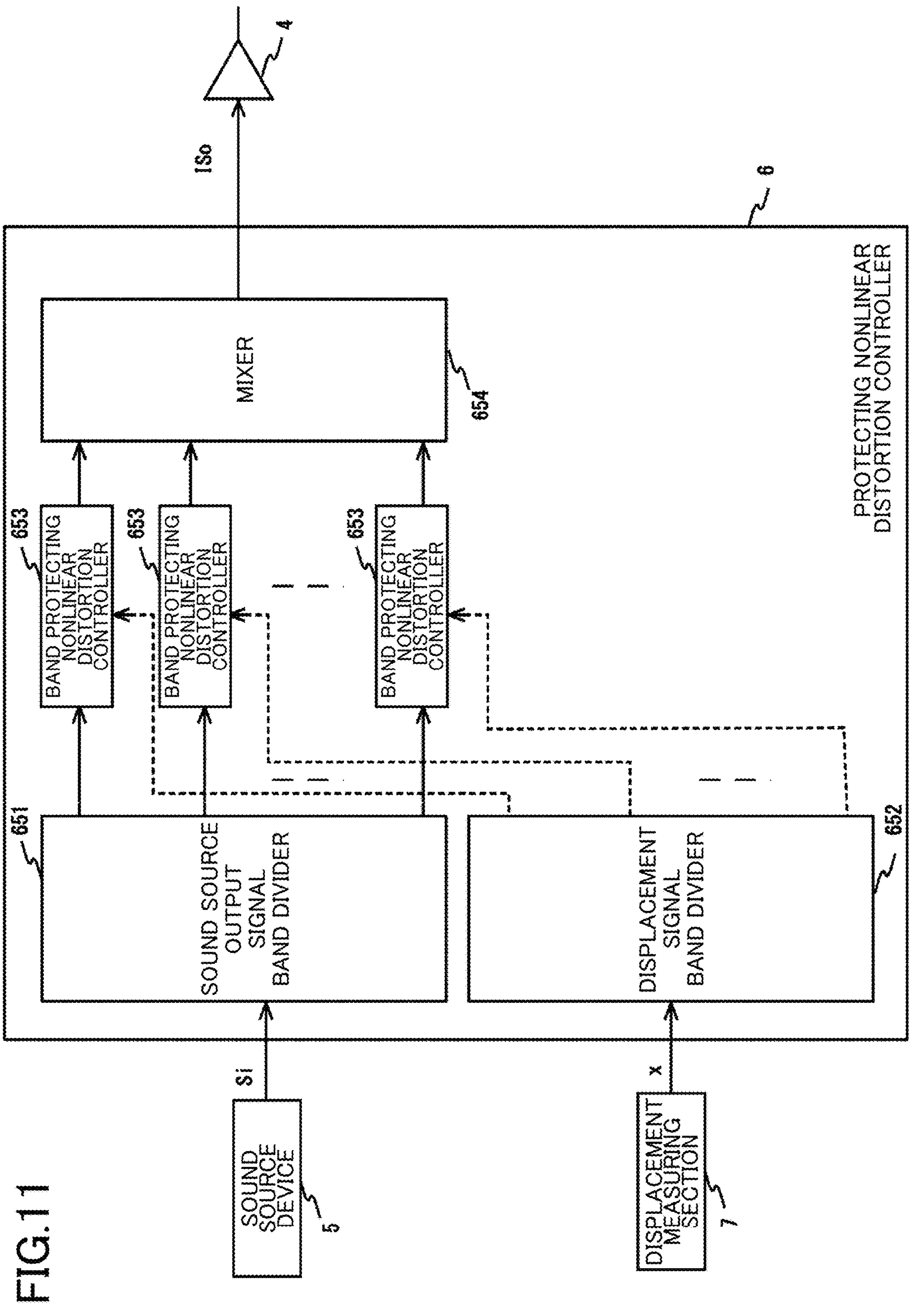
FIG. 11 is a diagram illustrating another configuration example of the protecting nonlinear distortion controller according to the embodiment of the present disclosure.

By using the protecting nonlinear distortion controller 6 configured to perform the process for each band as illustrated in FIG. 11, the suppression of the distortion correction operation and the attenuation of the sound source output signal Si can be performed only in a necessary band, and it is expected that the distortion factor is reduced in all bands.

What is claimed is:

1. A speaker distortion correction device comprising:

an amplifier configured to drive a speaker;

a distortion corrector, an input signal being input to the distortion corrector, and an output of the distortion corrector being input to the amplifier; and a displacement detector configured to detect displacement of a vibration system of the speaker, wherein the distortion corrector includes:

a nonlinear distortion controller configured to generate a corrected signal obtained by performing a nonlinear distortion correction process on the input signal to correct the input signal so that nonlinear distortion of the speaker is suppressed when the corrected signal is input to the amplifier;

a maximum value calculating section configured to calculate a maximum output value of the amplifier to be obtained when the corrected signal generated by the nonlinear distortion controller is input to the amplifier, based on at least the input signal and a gain of the amplifier, the gain of the amplifier being calculated based on the displacement detected by the displacement detector; and a selector configured to select, as the output of the distortion corrector, the corrected signal generated by the nonlinear distortion controller when the maximum output value calculated by the maximum value calculating section does not exceed a predetermined threshold and select, as the output of the distortion corrector, the input signal on which the nonlinear distortion correction process is not performed by the nonlinear distortion controller when the maximum output value calculated by the maximum value calculating section exceeds the predetermined threshold.

2. The speaker distortion correction device as claimed in claim 1, wherein the predetermined threshold is a maximum output value of the amplifier at which it is guaranteed that no abnormality of the speaker occurs, the abnormality of the speaker including clipping of an output of the speaker, destruction, or a bottom contact.

3. The speaker distortion correction device as claimed in claim 1, wherein the nonlinear distortion controller includes:

a nonlinear part correction filter, a target signal being input to the nonlinear part correction filter, the target signal being a signal on which the nonlinear distortion correction process is performed, and a transfer characteristic for correcting distortion due to a nonlinear characteristic of the speaker with respect to the target signal being set in the nonlinear part correction filter;

a linear inverse filter, an output of the nonlinear part correction filter being input to the linear inverse filter; and an adaptive algorithm executing section configured to adapt a transfer function of the linear inverse filter so that the displacement detected by the displacement detector becomes a displacement having no distortion with respect to the target signal.

4. The speaker distortion correction device as claimed in claim 1, wherein the maximum value calculating section calculates, as the maximum output value, a maximum value of a signal obtained by multiplying a signal obtained by performing a process the same as the nonlinear distortion correction process on the input signal by a gain of the amplifier.

5. The speaker distortion correction device as claimed in claim 1, wherein the maximum value calculating section calculates the maximum output value from a maximum value of the input signal in accordance with a preset relationship between the maximum value of the input signal and the maximum output value.

6. The speaker distortion correction device as claimed in claim 1, wherein the maximum value calculating section obtains a maximum value of displacement of a vibration system of the speaker by applying the input signal to an equivalent model of a linear speaker from which a nonlinear characteristic of the speaker is excluded, and calculates the maximum output value from the obtained maximum value of the displacement in accordance with a preset relationship between the maximum value of the displacement and the maximum output value.

7. A speaker distortion correction device comprising:

an amplifier configured to drive a speaker;

a distortion corrector, an input signal being input to the distortion corrector, and an output of the distortion corrector being input to the amplifier; and a displacement detector configured to detect displacement of a vibration system of the speaker, wherein the distortion corrector includes:

an attenuator configured to generate an attenuated input signal by attenuating the input signal with a variable attenuation amount;

a nonlinear distortion controller configured to generate a corrected signal obtained by performing a nonlinear distortion correction process on the input signal or the attenuated input signal to correct the input signal or the attenuated input signal so that nonlinear distortion of the speaker is suppressed when the corrected signal is input to the amplifier;

a maximum value calculating section configured to calculate a maximum output value of the amplifier to be obtained when the corrected signal obtained by performing the nonlinear distortion correction process on the input signal is input to the amplifier, based on at least the input signal and a gain of the amplifier, the gain of the amplifier being calculated based on the displacement detected by the displacement detector; and a selector configured to select, as the output of the distortion corrector, the corrected signal obtained by performing the nonlinear distortion correction process on the input signal when the maximum output value calculated by the maximum value calculating section does not exceed a predetermined threshold, and select, as the output of the distortion corrector, the corrected signal obtained by performing the nonlinear distortion correction process on the attenuated input signal generated by the variable attenuation amount being set so that a level of the attenuated input signal is less than or equal to a predetermined level when the maximum output value calculated by the maximum value calculating section exceeds the predetermined threshold.

8. The speaker distortion correction device as claimed in claim 7, wherein the predetermined level is a level of the attenuated input signal at which it is guaranteed that no abnormality of the speaker occurs when the corrected signal obtained by the nonlinear distortion controller performing the nonlinear distortion correction process on the attenuated input signal is input to the amplifier, the abnormality of the speaker including clipping of an output of the speaker, destruction, or a bottom contact.

9. A speaker distortion correction device comprising:

an amplifier configured to drive a speaker;

a distortion corrector, an input signal being input to the distortion corrector, and an output of the distortion corrector being input to the amplifier; and a displacement detector configured to detect displacement of a vibration system of the speaker, wherein the distortion corrector includes:

a band divider configured to divide the input signal into a plurality of band input signals for a plurality of bands;

a plurality of band distortion correctors provided respectively corresponding to the plurality of bands, and the plurality of band input signals being respectively input to the plurality of band distortion correctors; and a mixer configured to synthesize outputs of the plurality of band distortion correctors as the output of the distortion corrector, wherein each of the plurality of band distortion correctors includes:

a nonlinear distortion controller configured to generate a corrected signal obtained by performing a nonlinear distortion correction process on a corresponding band input signal among the plurality of band input signals to correct the corresponding band input signal so that nonlinear distortion of the speaker is suppressed when the corrected input signal is input to the amplifier;

a maximum value calculating section configured to calculate a maximum output value of the amplifier to be obtained when the corrected signal generated by the nonlinear distortion controller is input to the amplifier, based on at least the corresponding band input signal and a gain of the amplifier, the gain of the amplifier being calculated based on the displacement detected by the displacement detector; and a selector configured to select, as the output of the distortion corrector, the corrected signal generated by the nonlinear distortion controller when the calculated maximum output value calculated by the maximum value calculating section does not exceed a predetermined threshold and select, as the output of the distortion corrector, the corresponding band input signal on which the nonlinear distortion correction process is not performed by the nonlinear distortion controller when the calculated maximum output value calculated by the maximum value calculating section exceeds the predetermined threshold.

10. The speaker distortion correction device as claimed in claim 9, further comprising:

a displacement measuring section configured to output a displacement signal indicating displacement of a vibration system of the speaker; and a displacement signal band divider configured to divide the displacement signal into a plurality of band displacement signals for the plurality of bands and output the plurality of band displacement signals to the plurality of band distortion correctors corresponding to the plurality of bands, wherein the nonlinear distortion controller includes:

a nonlinear part correction filter, a target signal being input to the nonlinear part correction filter, the target signal being a signal on which the nonlinear distortion correction process is performed, and a transfer characteristic for correcting distortion due to a nonlinear characteristic of the speaker with respect to the target signal being set in the nonlinear part correction filter;

a linear inverse filter, an output of the nonlinear part correction filter being input to the linear inverse filter; and an adaptive algorithm executing section configured to adapt a transfer function of the linear inverse filter so that a corresponding band displacement signal among the plurality of band displacement signals becomes a displacement signal having no distortion with respect to the target signal.

11. A speaker distortion correction device comprising:

an amplifier configured to drive a speaker;

a distortion corrector, an input signal being input to the distortion corrector, and an output of the distortion corrector being input to the amplifier; and a displacement detector configured to detect displacement of a vibration system of the speaker, wherein the distortion corrector includes:

a band divider configured to divide the input signal into a plurality of band input signals for a plurality of bands;

a plurality of band distortion correctors provided respectively corresponding to the plurality of bands, and the plurality of band input signals being respectively input to the plurality of band distortion correctors; and a mixer configured to synthesize outputs of the plurality of band distortion correctors as the output of the distortion corrector, wherein each of the plurality of band distortion correctors includes:

an attenuator configured to generate an attenuated input signal by attenuating a corresponding band input signal among the plurality of band input signals with a variable attenuation amount;

a nonlinear distortion controller configured to generate a corrected signal obtained by performing a nonlinear distortion correction process on the corresponding band input signal or the attenuated input signal to correct the input signal or the attenuated input signal so that nonlinear distortion of the speaker is suppressed when the corrected signal is input to the amplifier;

a maximum value calculating section configured to calculate a maximum output value of the amplifier to be obtained when the corrected signal obtained by the nonlinear distortion controller performing the nonlinear distortion correction process on the corresponding band input signal is input to the amplifier, based on at least the corresponding band input signal and a gain of the amplifier, the gain of the amplifier being calculated based on the displacement detected by the displacement detector; and a selector configured to select, as the output of the distortion corrector, the corrected signal obtained by performing the nonlinear distortion correction process on the corresponding band input signal when the maximum output value calculated by the maximum value calculating section does not exceed a predetermined threshold, and set an attenuation amount as the variable attenuation amount to generate the attenuated input signal whose level is less than or equal to a predetermined level and select, as the output of the distortion corrector, the corrected signal obtained by performing the nonlinear distortion correction process on the attenuated input signal when the maximum output value calculated by the maximum value calculating section exceeds the predetermined threshold.

* * * * *